United States Patent [19]

Ishimori

[11] Patent Number: 5,383,783
[45] Date of Patent: Jan. 24, 1995

[54] SUBSTRATE HANDLING APPARATUS

[75] Inventor: Takashi Ishimori, Mizusawa, Japan

[73] Assignees: Tokyo Electron Kabushiki Kaisha; Tokyo Electron Tohoku Kabushiki Kaisha, both of Tokyo, Japan

[21] Appl. No.: 130,441

[22] Filed: Oct. 1, 1993

[30] Foreign Application Priority Data

Oct. 6, 1992 [JP] Japan .................................. 4-267171

[51] Int. Cl.⁶ .............................................. F27D 5/00
[52] U.S. Cl. .................... 432/253; 432/152; 432/258; 432/5; 432/6
[58] Field of Search ................. 432/253, 258, 259, 5, 432/6, 152

[56] References Cited

U.S. PATENT DOCUMENTS

| | | | |
|---|---|---|---|
| 4,355,974 | 10/1982 | Lee | 432/253 |
| 4,954,079 | 9/1990 | Yamaya | 432/152 |
| 5,030,056 | 7/1991 | Kitayama et al. | 414/749 |
| 5,206,627 | 4/1993 | Kato | 414/DIG. 2 |

Primary Examiner—Henry C. Yuen
Attorney, Agent, or Firm—Beveridge, DeGrandi, Weilacher & Young

[57] ABSTRACT

A pusher which pushes up semiconductor wafers has wafer fixing grooves to which they are fixed. Wafer detecting sensors which detect whether the semiconductor wafers are present are positioned in side walls of the wafer fixing grooves. The pusher is composed of an grounded aluminum base material and a resin coat formed on the base material. The surface of the aluminum base material is alumite-treated. The resin coat has a thickness of approximately 20 μm. The resin coat is made of Teflon.

10 Claims, 6 Drawing Sheets

SUBSTRATE HANDLING APPARATUS

BACKGROUND OF THE INVENTION

1. Field of the Invention

The present invention relates to a substrate handling apparatus.

2. Description of the Related Art

Conventionally, in semiconductor device fabrication processes, various types of substrate handling apparatuses which handle for example semiconductor wafers and LCD glass substrates have been used.

For example, in a flat-type or upright-type heat treating apparatus, semiconductor wafers are processed over a wafer boat which is made of quartz. To transfer the semiconductor wafers between the wafer boat and a wafer cassette which is made of a resin, a wafer transferring apparatus has been used. An example of the wafer transferring apparatus is a pushing apparatus which is known as a pusher. The pusher pushes up semiconductor wafers which are stocked in a wafer cassette and transfers them to a wafer boat while supporting them.

As is well known, in semiconductor device fabrication processes which form very small electric circuits over substrates, very fine particles tend to adhere to substrates, resulting in defects of final semiconductor devices, which lead to a decrease of yield. Thus, to prevent such a problem, in the above-described wafer transferring apparatus, a substrate supporting portion which comes in contact with a substrate and supports it is formed by molding a block of resin such as Teflon (trade name) in a predetermined shape. Thus, the adhesion of particles to substrates can be prevented and thereby the yield of the fabrication can be improved.

In a substrate handling apparatus such as a wafer transferring apparatus, optical-type or capacitance-type wafer detecting sensors are sometimes buried in the substrate supporting portion made of the Teflon block so as to detect whether or not semiconductor wafers are present on the substrate supporting portion.

However, substrates such as semiconductor wafers tend to be statically charged. For example, after washing process or the like, while a wafer cassette is being transferred, semiconductor wafers contained therein vibrate and thereby they rub each other. As a result, the semiconductor wafers may be charged at high voltages ranging from 10 kV to 20 kV. Thus, in the above-mentioned substrate handling apparatus, due to such a static electricity, an excessive current flows in the sensors and the like which detect whether or not substrates are present. Consequently, the sensors and the like may be damaged or/and the apparatus may malfunction.

To avoid such a problem, the substrate supporting portion may be formed of an electroconductive material such as a metal. In this case, however, the substrates such as semiconductor wafers make contact to the substrate supporting portion made of a metal. Thus, since they rub each other, particles take place.

SUMMARY OF THE INVENTION

The present invention is made from the above-described point of view. An object of the present invention is to provide a substrate handling apparatus which suppresses the occurrence of particles so as to improve the yield of fabrication of semiconductor devices. Another object of the present invention is to provide a substrate handling apparatus which prevents sensors and the like from being damaged in the case that substrates to be handled are statically charged at high voltages and from malfunctioning so as to accomplish high reliability of the final semiconductor devices.

A first aspect of the present invention is a substrate handling apparatus, comprising a substrate supporting portion for fixing and supporting substrates, wherein the substrate supporting portion is composed of a grounded electroconductive base material and a resin coat formed on a portion of the surface of the base material which is adapted to be contact with the substrates, the substrate supporting portion being adapted to discharge a static electricity in the substrates through the coat to the base material.

A second aspect of the present invention is a substrate handling apparatus, comprising a substrate supporting portion for fixing and supporting substrates, and a detecting sensor means for detecting whether the substrates are present in the substrate supporting portion, wherein the substrate supporting portion is composed of a grounded electroconductive base material and a resin coat formed on a portion of the surface of the base material which is adapted to be contact with the substrates, the substrate supporting portion being adapted to discharge a static electricity in the substrates through the coat to the base material.

In the substrate handling apparatus according to the present invention, a substrate supporting portion which supports substrates is composed by forming a resin made of for example Teflon with a thickness of for example 5 to 50 micro-m on the surface of a base material made of an electroconductive metal such as aluminum.

Thus, only the resin coat directly comes in contact with the substrates. In other words, since the base material of the substrate supporting portion do not directly come in contact with the substrates and thereby they do not rub each other, nor do they generate particles. In addition, when the substrates statically charged at high voltages are supported, at the moment or just before the substrates come in contact with the substrate supporting portion, electricity flows from the substrates to the electroconductive base material of the substrate supporting portion through the resin coat with a thickness of for example 5 to 50 μm. Thus, the static electricity in the substrates are removed. Consequently, the substrate detecting sensors and the like can be prevented from being damaged and from malfunctioning. As a result, the reliability of fabrication of semiconductor devices can be improved.

These and other objects, features and advantages of the present invention will become more apparent in light of the following detailed description of best mode embodiments thereof, as illustrated in the accompanying drawings.

DETAILED DESCRIPTION OF THE PREFERRED EMBODIMENTS

First Embodiment

Next, with reference to the accompanying drawings, a wafer transferring apparatus according to a first embodiment of the present invention will be described. The wafer transferring apparatus transfers semiconductor wafers between a wafer cassette and a heat treating apparatus.

Figure 2:
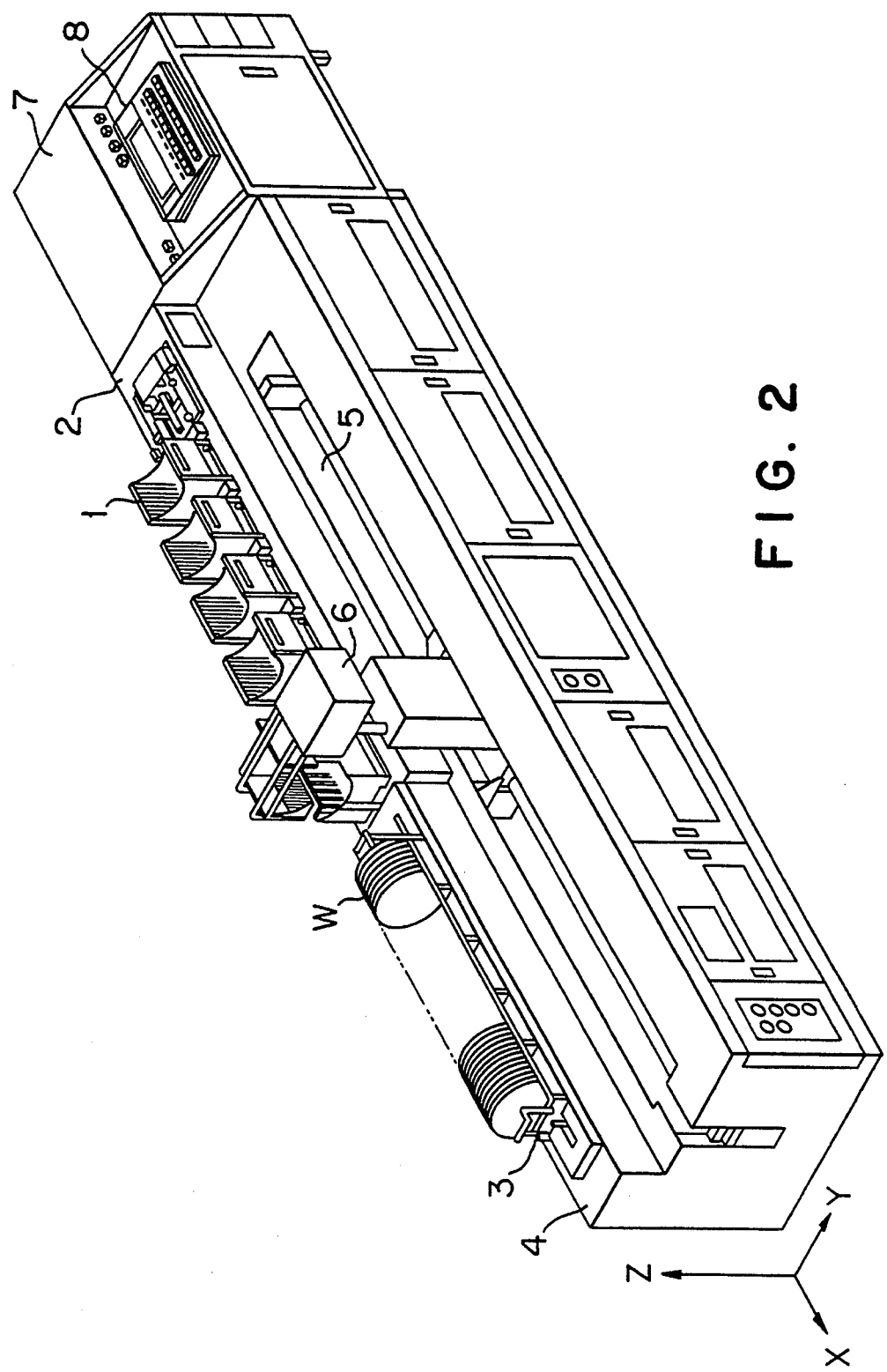
FIG. 2 is a perspective view showing the overall construction of the wafer transferring apparatus according to the first embodiment.

FIG. 2 shows the overall construction of a wafer transferring apparatus as a substrate handling apparatus according to a first embodiment of the present invention. The wafer transferring apparatus is disposed in front of a flat-type or upright-type heat treating furnace (not shown).

As shown in FIG. 2, the wafer transferring apparatus has a cassette stage 2 and a boat stage 4 which are serially disposed nearly on the same level. A plurality of wafer cassettes 1 are placed on the cassette stage 2. A wafer boat 3 is placed on the boat stage 4. Along the cassette stage 2 and the boat stage 4, a traveling groove 5 is defined. A holding device 6 for holding semiconductor wafers is disposed in the traveling groove 5 and travels along a X axis of the wafer transferring apparatus.

In addition, in a main body 7 of the wafer transferring apparatus, a variety of drive mechanisms are disposed. These drive mechanisms are electrically connected to a computer. Data necessary for controlling the wafer transferring apparatus (for example, the number of semiconductor wafers transferred to the wafer boat 3, the pitches of the semiconductor wafers, and the conditions where semiconductor wafers are contained in a wafer cassette 1) are input to the computer by the operations of a keyboard 8.

Figure 3:
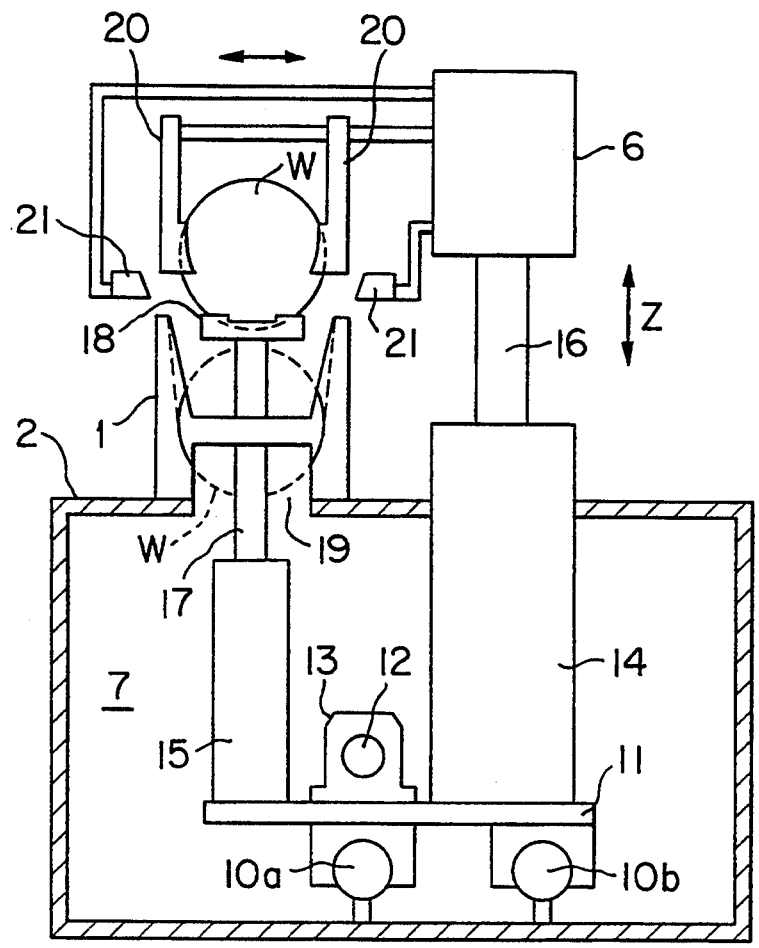
FIG. 3 is a side view showing the construction of principal portions of the wafer transferring apparatus according to the first embodiment.

As shown in FIG. 3, over the bottom surface of the main body 7, a pair of rails 10a and 10b are disposed along the traveling groove 5 (in the direction of the X axis). A slider 11 is disposed over the rails 10a and 10b. A ball screw 12 is disposed above the slider 11 in parallel with the rails 10a and 10b. The ball screw 12 is connected to a drive shaft of a motor (not shown) disposed at an end of the X axis. A ball nut 13 is disposed over the slider 11. The ball screw 12 is threaded into the ball nut 13. The ball screw 12 is rotated by the motor (not shown) so that the slider 11 is travelled along the rails 10a and 10b in a predetermined direction for a predetermined distance.

Two lifting mechanisms 14 and 15 are arranged over the slider 11. The lifting mechanisms 14 and 15 each employ an air cylinder or the like. A rod 16 of the lifting mechanism 14 supports the above-mentioned holding device 6. With the lifting mechanism 14, the holding device 6 is lifted up in the direction of the Z axis of the apparatus.

On the other hand, the lifting mechanism 15 is provided with a rod 17. The rod 17 has a pusher (substrate supporting portion) 18. Thus, a plurality of (for example, 25) semiconductor wafers W contained in a wafer cassette 1 provided over the cassette stage 2 can be pushed up from a lower portion of the wafer cassette 1 through an opening 19 defined on the cassette stage 2.

Figure 1:
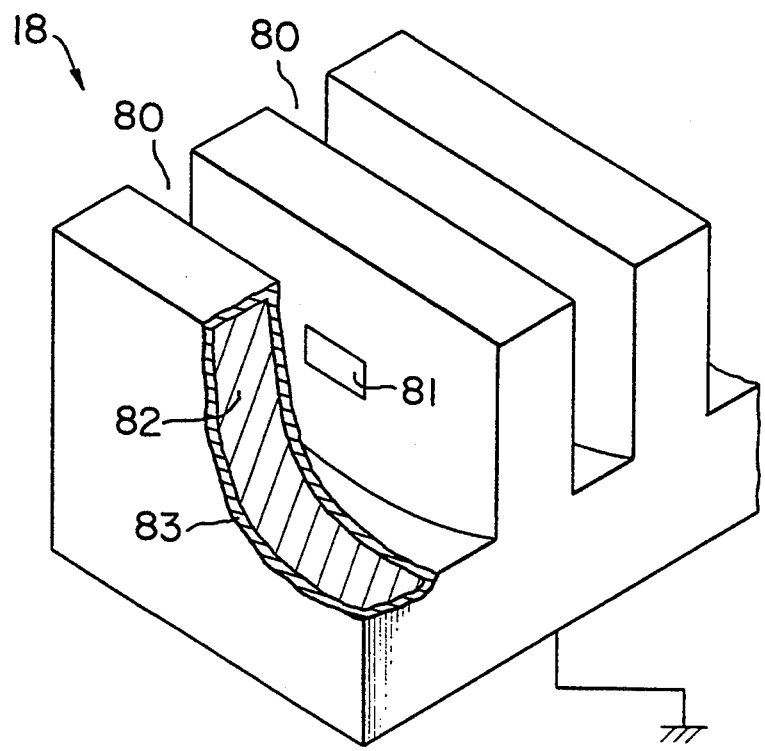
FIG. 1 is a perspective view showing the construction of a pusher for use in a wafer transferring apparatus according to a first embodiment of the present invention.
Figure 4:
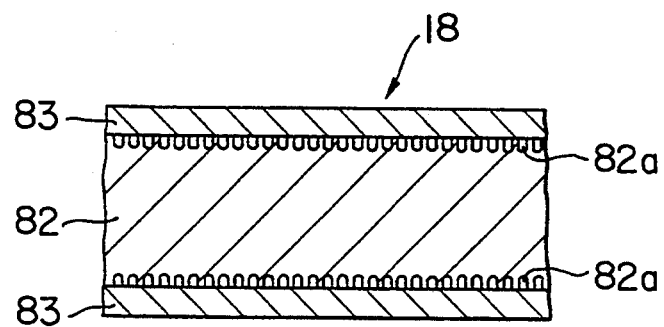
FIG. 4 is a partial sectional view showing the pusher of FIG. 1.

As partially shown in FIG. 1, the pusher 18 has a plurality of (for example, 25) wafer fixing grooves 80 in which respective semiconductor wafers W are positioned. Wafer detecting sensors 81 are disposed in walls of the wafer fixing grooves 80. The wafer detecting sensors 81 detect whether or not a semiconductor wafer W is present in the corresponding wafer fixing groove 80. Each wafer detecting sensor 81 comprises a light emitting portion and a light receiving portion. The light emitting portion is disposed in one side wall of a wafer fixing groove 80, whereas the light receiving portion is disposed in the other side wall thereof. The pusher 18 is composed of an electroconductive base material 82 and a resin coat 83 formed on the surface of the base matgerial 82. The base material 82 is grounded. In this embodiment, as shown in FIG. 4, the base material 82 is made of aluminum which is alumite-treated and the surface thereof has a large number of pores 82a. Teflon (Trade Name) with a thickness of approximately 20 μm is coated on the porous surface of the base material 82 by a coating process. Thus, the resin coat 83 is formed. In this situation, part of Teflon is penetrated into the large number of pores 82a.

The thickness of the resin coat 83 is preferably in the range from 5 to 50 μm. In other words, when the thickness of the resin coat 83 is less than 5 μm, a buffering effect of the resin coat 83 is reduced. On the other hand, when the thickness of the resin coat 83 exceeds 50 μm, the static electricity in the semiconductor wafers W is not satisfactorily discharged from the wafer W to the base material 82.

In addition, as shown in FIG. 3, the holding device 6 is provided with two types of wafer holding mechanisms 20 and 21 which hold every second wafer W of a wafer cassette 1. The wafer holding mechanism 20 is disposed over the wafer holding mechanism 21.

In other words, the upper wafer holding mechanism 20 extracts every second semiconductor wafer W (namely, 13 of 25 semiconductor wafers W) from a wafer cassette 1 at predetermined pitches (3/16 inches). The lower wafer holding mechanism 21 extracts the remaining 12 semiconductor wafers W. By selectively opening and/or closing the wafer holding mechanisms 20 and 21, the semiconductor wafers W can be transferred between the cassette 1 and the wafer boat 3 at normal pitches of 3/16 inches or double pitches of 6/16 inches.

Next, the operation of the wafer transferring apparatus according to this embodiment will be described.

When a wafer cassette 1 which contains semiconductor wafers W to be processed is placed at a predetermined position of the cassette stage 2, the above-described motor (not shown) causes the ball screw 12 to rotate, thereby traveling the slider 11 along the rails 10a and 10b. Thus, the holding device 6 is placed at a predetermined position in parallel with a predetermined wafer cassette 1. In addition, the pusher 18 is placed at a predetermined position in the bottom of the wafer cassette 1.

Next, as shown in FIG. 3, the lifting mechanism 15 raises the pusher 18. Thus, the semiconductor wafers W contained in the wafer cassette 1 are positioned to the wafer fixing grooves 80 of the pusher 18 and pushes up thereby.

When semiconductor wafers W contained in a wafer cassette 1 are statically charged at high voltages, at the moment or just before an upper end portion of each wafer fixing groove 80 comes into contact with a corresponding semiconductor wafer W, the static electricity in the semiconductor wafer W flows to the electroconductive base material 82 through the thin resin coat 83 with a thickness of approximately 20 μm. Thus, the static electricity in the semiconductor wafer W is removed. Consequently, since an excessive current does not flow in the wafer detecting sensors 81, it can be prevented from being damaged and from malfunctioning.

Thereafter, the semiconductor wafers W pushed up by the pusher 18 from the wafer cassette 1 are held by the wafer holding mechanisms 20 and 21 of the holding device 6. Next, the pusher 18 is lowered.

Then, the above-mentioned motor (not shown) causes the ball screw 12 to rotate, thereby traveling the slider 11 along the rails 10a and 10b. Thus, the holding device 6 which holds the semiconductor wafers W is placed at a predetermined position in parallel with the wafer boat 3 over the boat stage 4.

Thereafter, the lifting mechanism 14 lowers the holding device 6. The semiconductor wafers W held by the holding mechanisms 20 and 21 are placed at a predetermined position of the wafer boat 3. Then, the holding mechanisms 20 and 21 are opened and thereby the semiconductor wafers W are transferred to the wafer boat 3.

By repeating these processes several times, a predetermined number of semiconductor wafers W are transferred from a wafer cassette 1 over the cassette stage 2 to the wafer boat 3 over the boat stage 4.

To change the pitches of semiconductor wafers W contained in a wafer cassette 1 and the pitches of semiconductor wafers W contained in the wafer boat 3, as described above, by selectively opening and/or closing the holding mechanisms 20 and 21, every second semiconductor wafer W is held and transferred. When the semiconductor wafers W are transferred from the wafer boat 3 to the wafer cassette 1, the above-described processes are reversely performed.

As described above, according to this embodiment, even if the semiconductor wafers W are statically charged at high voltages, since an excessive current does not flow in the wafer detecting sensors 81 of the pusher 18, they can be prevented from being damaged and from malfunctioning. In addition, since the semiconductor wafers W do not directly come in contact with a metal, particles can not be generated.

Second Embodiment

Figure 5:
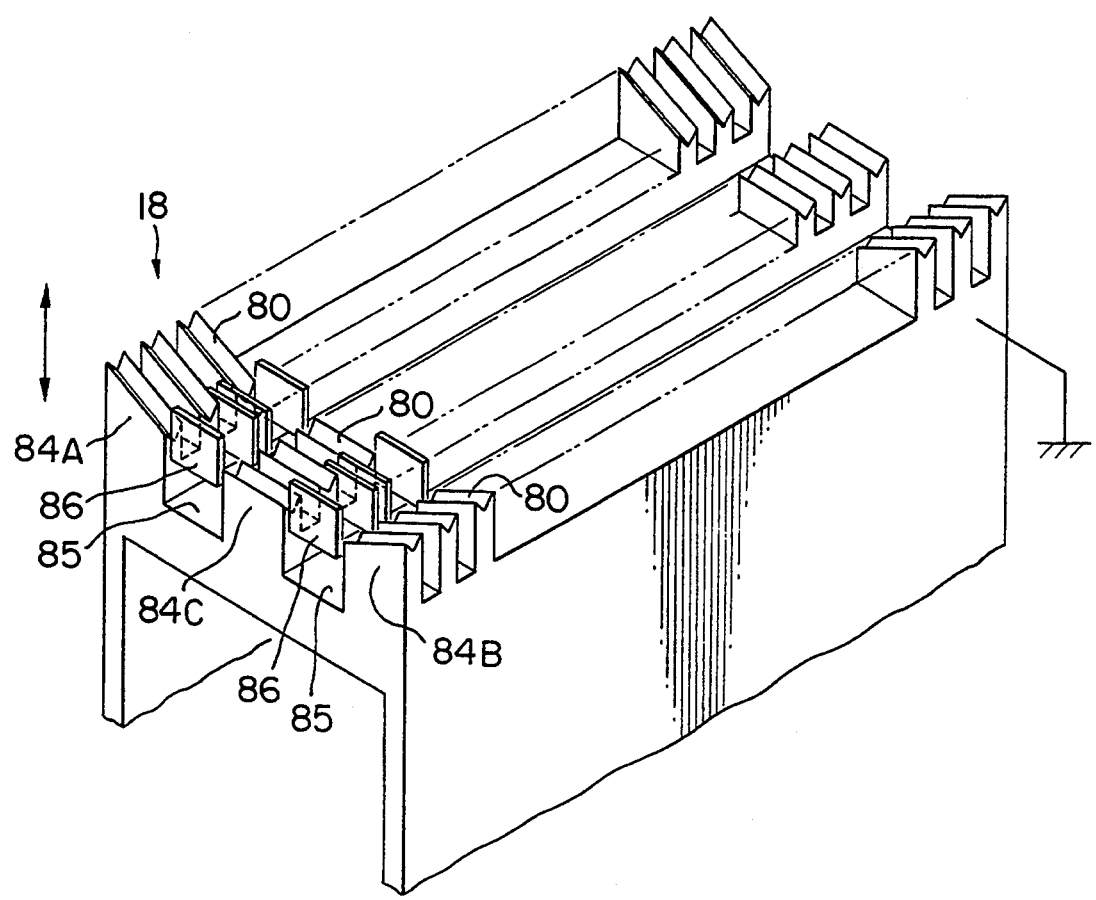
FIG. 5 is a perspective view showing the construction of a pusher for use in a wafer transferring apparatus according to a second embodiment of the present invention.

Next, with reference to FIG. 5, a second embodiment of the present invention will be described. In the figure, a pusher 18 of a wafer transferring apparatus is shown. As shown in the figure, the pusher 18 has three supporting portions 84A, 84B, and 84C which support semiconductor wafers W (see FIG. 3). Each of the supporting portions 84A, 84B, and 84C has a plurality of wafer fixing grooves 80 to which corresponding semiconductor wafers W are positioned. Among the wafer fixing grooves 80 of the supporting portions 84A, 84B, and 84C, a pair of wafer detecting sensors 85, 86 are disposed. The pair of wafer detecting sensor 85, 86 detect whether or not a semiconductor wafer W is present.

The pair of wafer detecting sensor pair consists of a light emitting portion 85 and a light receiving portion 86. Between the supporting portions 84A and 84C and between the supporting portions 84B and 84C, the light emitting portions 85 and the light receiving portions 86 are disposed in a zigzag pattern. As with the pusher shown in FIG. 4, the pusher 18 shown in FIG. 5 is composed of a grounded aluminum base material 82 and a Teflon coat 83.

Third Embodiment

Next, with reference to FIG. 6, a third embodiment of the present invention will be described. In the figure, a pusher 107 is disposed below a wafer cassette 102. The pusher 107 has wafer fixing grooves 106, whereas the wafer cassette 102 has grooves 103. The pusher 107 is lifted up by a lifting mechanism 105 having an air cylinder 105a. The lifting mechanism 105 has a drive device 109 and a table 108 as well. In addition, the pusher 107 contains wafer detecting sensors 112, each of which detects whether or not a semiconductor wafer W is present. Each wafer detecting sensor 112 consists of a light emitting portion 110 and a light receiving portion 111. The light emitting portions 110 and the light receiving portions 111 are disposed in the pusher 107 in a zigzag pattern. The light emitting portions 110 and the light receiving portions 111 are electrically connected to corresponding sensor modules 113. The sensor modules 113 are electrically connected to a detection section 114.

Figure 6:
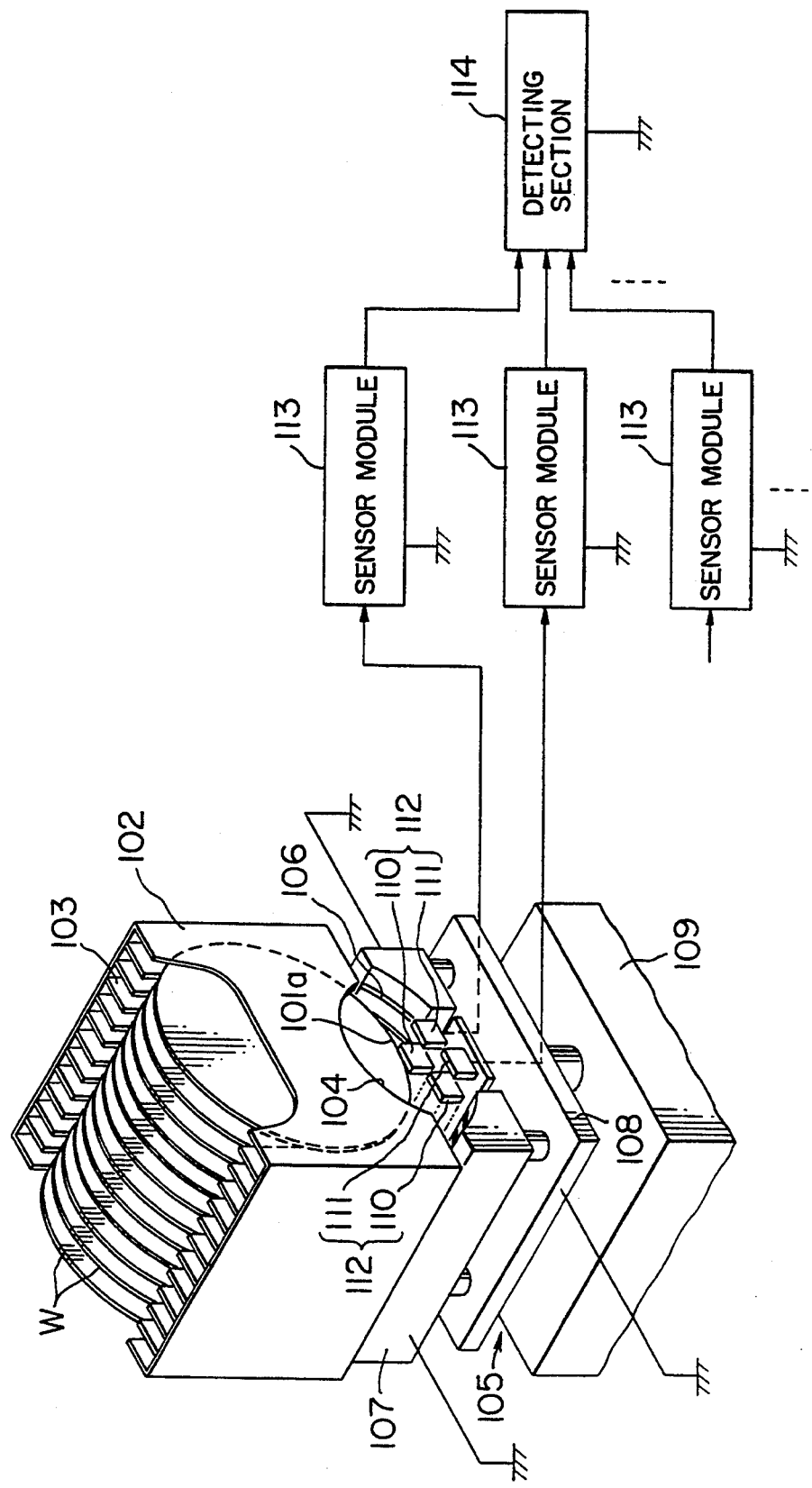
FIG. 6 is a perspective view showing the construction of a pusher for use in a wafer transferring apparatus according to a third embodiment of the present invention.

In FIG. 6, the pusher 107 is composed of a grounded aluminum base material 82 and a Teflon coat 83 as with the pusher shown in FIG. 4. In addition, the table 108, the sensor modules 113, and the detection section 114 are individually grounded.

Fourth Embodiment

Figure 7:
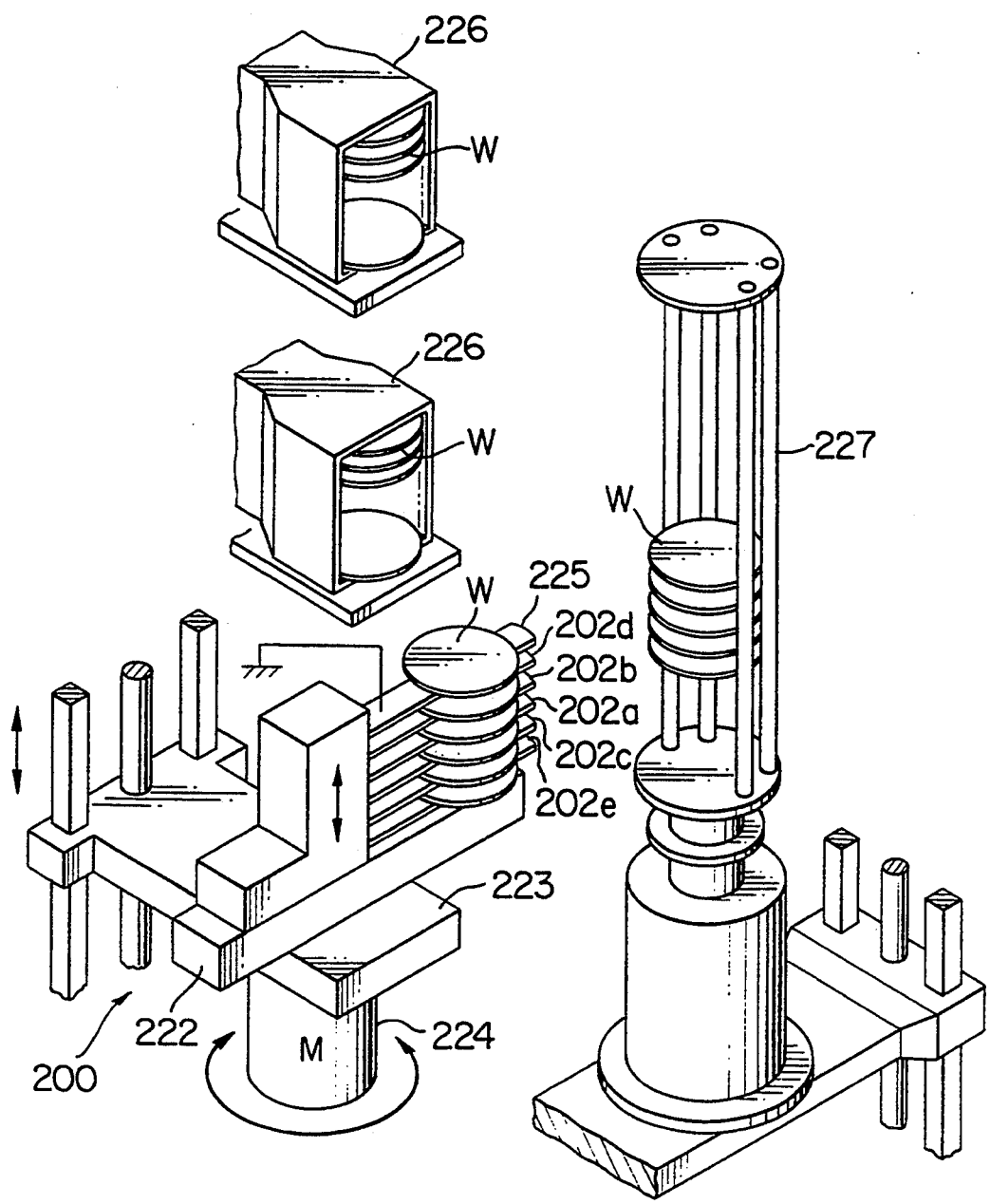
FIG. 7 is a perspective view showing the construction of a wafer transferring apparatus according to a fourth embodiment of the present invention.

Next, with reference to FIG. 7, a fourth embodiment of the present invention will be described. In the figure, semiconductor wafers W which are contained in a wafer cassette 226 is transferred to a wafer boat 227 by a wafer transferring apparatus 200.

The wafer transferring apparatus 200 has a base 223 and a supporting table 222. The base 223 can be vertically traveled. The supporting table 222 is rotatably mounted on the base 223. The supporting table 222 is rotated by a motor 224. The supporting table 222 has a plurality of support arms (substrate supporting portions) 202a to 202e which expansible support semiconductor wafers W. In FIG. 7, each of the support arms 202a to 202e is composed of a grounded aluminum base material 82 and a Teflon coat 83 as with the pusher shown in FIG. 4.

In the above-described embodiments, the present invention was applied to the pushers 18 and 107 for use in the wafer transferring apparatuses and the support arms 202a to 202e. However, it should be appreciated that the present invention may be applied to the holding mechanisms 20 and 21 for use in the holding device 6 shown in FIG. 3. In addition, the present invention may be applied to the contact portions of the cassette stage 2 to the wafer cassettes 1, 102, and 226. Moreover, as well as the wafer transferring apparatus, the present invention can be applied to any substrate handling apparatus which handles substrates such as semiconductor wafers W and LCD glass substrates.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A substrate handling apparatus, comprising:
   a substrate supporting portion for fixing and supporting substrates,
   wherein said substrate supporting portion is composed of a grounded electroconductive base material and a resin coat formed on a portion of the surface of said base material which is adapted to be in contact with said substrates, said substrate supporting portion being adapted to discharge a static electricity in said substrates through said coat to said base material.

2. The substrate handling apparatus as set forth in claim 1,
   wherein said base material is made of aluminum, and the surface thereof is alumite-treated so as to form pores thereon.

3. The substrate handling apparatus as set forth in claim 2,
   wherein said resin coat partially enters said pores.

4. The substrate handling apparatus as set forth in claim 1,
   wherein the thickness of said resin coat is in the range from 5 to 50 μm.

5. The substrate handling apparatus as set forth in claim 1,
   wherein said resin coat is made of Teflon.

6. A substrate handling apparatus, comprising:
   a substrate supporting portion for fixing and supporting substrates; and
   detecting sensor means for detecting whether said substrates are present in said substrate supporting portion,
   wherein said substrate supporting portion is composed of a grounded electroconductive base material and a resin coat formed on a portion of the surface of said base material which is adapted to be in contact with said substrates, said substrate supporting portion being adapted to discharge a static electricity in said substrates through said coat to said base material.

7. The substrate handling apparatus as set forth in claim 6,
   wherein said base material is made of aluminum, and the surface thereof is alumite-treated so as to form pores thereon.

8. The substrate handling apparatus as set forth in claim 7,
   wherein said resin coat partially enters said pores.

9. The substrate handling apparatus as set forth in claim 6,
   wherein the thickness of said resin coat is in the range from 5 to 50 μm.

10. The substrate handling apparatus as set forth in claim 6,
    wherein said resin coat is made of Teflon.

* * * * *